United States Patent [19]
Nishikawa et al.

[11] Patent Number: 4,944,837
[45] Date of Patent: Jul. 31, 1990

[54] METHOD OF PROCESSING AN ARTICLE IN A SUPERCRITICAL ATMOSPHERE

[75] Inventors: Masaru Nishikawa, Tsutsujigaoka Haimu A-409, 13-3, Shibazaki 2-chome, Chofu-shi, Tokyo, Japan; Kazumichi Nakagawa; Yohichi Yamaguchi, both of Tokyo, Japan

[73] Assignees: Masaru Nishikawa; Hoya Corporation, both of Tokyo, Japan

[21] Appl. No.: 317,202

[22] Filed: Feb. 28, 1989

[30] Foreign Application Priority Data

Feb. 29, 1988 [JP] Japan ................................. 63-47196

[51] Int. Cl.$^5$ .......................... B44C 1/22; C23F 1/02; B29C 37/00; C03C 15/00
[52] U.S. Cl. ....................................... 156/646; 134/31; 134/105; 156/656; 156/659.1; 156/345; 156/668; 430/318; 430/323; 430/329
[58] Field of Search ............... 156/646, 650, 651, 652, 156/656, 659.1, 664, 665, 668, 662, 345; 430/313, 317, 318, 323, 329; 134/31, 42, 102, 105

[56] References Cited

U.S. PATENT DOCUMENTS 4,341,592 7/1982 Shortes et al. .................. 156/646 X Primary Examiner—William A. Powell
Attorney, Agent, or Firm—Ladas & Parry

[57] ABSTRACT

In a method of processing an article, the article is introduced into a supercritical atmosphere which is formed in a pressure vessel and which atmosphere comprises carbon dioxide. When the article comprises an exposed resist film on a surface layer formed on a substrate, the exposed resist film is selectively removed to leave a predetermined pattern in the supercritical atmosphere and is thus processed into a patterned resist film. After the surface layer is selectively etched through the patterned resist film to form a patterned surface layer, the patterned resist film may be introduced into the supercritical atmosphere to be completely removed from the patterned surface layer. On processing the article, such as a compact disc, a mechanical parts, or the like, the article may be also introduced into the supercritical atmosphere to be cleaned up.

20 Claims, 4 Drawing Sheets

METHOD OF PROCESSING AN ARTICLE IN A SUPERCRITICAL ATMOSPHERE

BACKGROUND OF THE INVENTION

This invention relates to a method for use in processing an article, such as a reticle, a mask, or the like. It is to be noted here that such an article may not always comprise a substrate and a surface layer, although description will be mainly restricted to an article comprising both a substrate and a surface layer. In addition, it is assumed that such a surface layer underlies a resist film which is unpatterned or patterned, although the surface layer may not always underlie any resist film. For brevity of description, it is further assumed that the surface layer comprises an unpatterned layer underlying an unpatterned resist film which is preliminarily subjected to exposure to form a latent image therein after deposition of the unpatterned layer on the substrate. Such an article comprising an unpatterned resist film will be referred to as an unpatterned article.

A conventional method serves to process an unpatterned article comprising an unpatterned surface layer and an unpatterned resist film. The unpatterned resist film is exposed in a pre-processing step so that a predetermined pattern is formed as a latent image in the unpatterned resist film. The unpatterned resist film mentioned above is developed in a developing step to form a patterned resist film on the unpatterned surface layer.

Subsequently, washing, rinsing, and drying steps are successively carried out as a processing step in relation to the patterned resist film attached to the substrate. During the processing step for the resist film, various sorts of solvents must be used to selectively remove the unpatterned resist film to leave the latent image and to thereby form the patterned resist film.

Thereafter, the unpatterned surface layer is selectively etched through the patterned resist film to render the unpatterned surface layer into a patterned surface layer. After formation to the patterned surface layer, the patterned resist film is removed and washed out. Subsequently, such washing and rinsing steps are followed by a drying step. Thus, the etching, the removing, the washing out, and the drying steps are carried out to leave the patterned surface layer on the substrate after the pre-processing and may be collectively called a patterning step.

During the removing step, the patterned resist film is removed by making use of a plurality of solvents. Specifically, a selected one of a solution of oxidizing agent, an organic solvent, and an oxygenic plasma may be used to remove the patterned resist film in the removing step. At any rate, a great amount of each solvent must be used to completely remove the patterned resist film. In addition, the oxidizing agent is liable to damage the substrate while the patterned resist film is not readily removed by the organic solvent. In addition, use of the oxygenic plasma results in pollution of the substrate because undesired materials, such as metal, are attached to the substrate.

As regards the washing out step, use of a liquidized or a supercritical gas has been disclosed in Japanese Unexamined Patent Publication No. 192333/1985 (Tokkai Syô 60-192333). In this event, a patterned surface layer is positioned into a pressure vessel or chamber with a substrate and is kept in a liquidized or a supercritical gas during a predetermined interval of time. After lapse of the predetermined interval, the pressure is rapidly decreased in the pressure chamber. The resultant gas is rapidly expanded, which brings about removal of the resist film remaining on the substrate, as clearly pointed out in the above-referenced publication. However, it has been found that such rapid expansion of the liquidized or the supercritical gas gives rise to damage of the substrate.

In any event, the washing and the rinsing steps must be repeated in the processing and the patterning steps. Therefore, the conventional method is troublesome and takes a long time.

SUMMARY OF THE INVENTION

It is an object of this invention to provide a method of quickly processing an article by a small number of steps.

It is another object of this invention to provide a method of the type described, which is suitable for quickly processing a resist film without any damage to a substrate.

It is still another object of this invention to provide a method of the type described, which can readily remove a patterned resist film.

According to a first aspect of this invention, there is provided a method of forming a patterned resist film having a predetermined pattern on a surface layer formed on a substrate. The method comprises the steps of depositing a resist film on the surface layer, pre-processing the resist film into a pre-processed resist film which is attached to the surface layer and which has a latent image of the predetermined pattern, and processing the pre-processed resist film into the patterned resist film. The processing step comprises the steps of introducing the pre-processed resist film together with the substrate into a supercritical atmosphere and developing the pre-processed resist film in the supercritical atmosphere to selectively remove the pre-processed resist film in accordance with the latent image and to thereby form the resist film.

According to a second aspect of this invention, there is provided a method of forming a patterned surface layer on a substrate. The method comprises the steps of forming an unpatterned surface layer on the substrate, forming a patterned resist film on the unpatterned surface layer, selectively removing the unpatterned surface layer through the patterned resist film to form the patterned surface layer, introducing the patterned resist film into a supercritical atmosphere together with the substrate having the patterned surface layer; and removing the patterned resist film from the patterned surface layer within the supercritical atmosphere.

DESCRIPTION OF THE PREFERRED EMBODIMENTS

Description will be made as regards a method according to a first embodiment of this invention.

Preliminary Step

A disc shaped silicon wafer is prepared at first as a substrate which has a diameter of 3 inches. The silicon wafer has a front surface and a back surface. A surface layer is formed on the front surface in a manner known in the art. A positive electron beam resist, for example, a polymethyl methacrylate (PMMA) is coated on the surface layer at a thickness of 5000 angstroms (Å) in a manner known in the art. Thus, an unpatterned resist film is deposited on the surface layer.

The unpatterned resist film is pre-processed into a pre-processed resist film. The pre-processed resist film is attached on the surface layer and has a latent image of a predetermined pattern. To be concrete, the unpatterned resist film is exposed by an electron beam delineating device to delineate a predetermined pattern and to form an exposed resist film having a latent image. Such as exposing step and an exposed resist film may be called a pre-processing step of the unpatterned resist film and a pre-processed resist film, respectively.

More specifically, the electron beam delineating device generates an acceleration voltage of, for example, 20 kilo volts to accelerate electrons. The accelerated electrons are irradiated in the form of an electron beam onto the unpatterned resist film so as to form the latent image in the unpatterned resist film. Practically, the electron beam is irradiated with a dose of, for example, 50 $\mu C/cm^2$. The predetermined pattern is assumed to have a line width and spacing of 0.5 $\mu m$ as a minimum.

A processing step follows the pre-processing step to process the pre-processed resist film into a patterned resist film.

Processing Step

Figure 1:
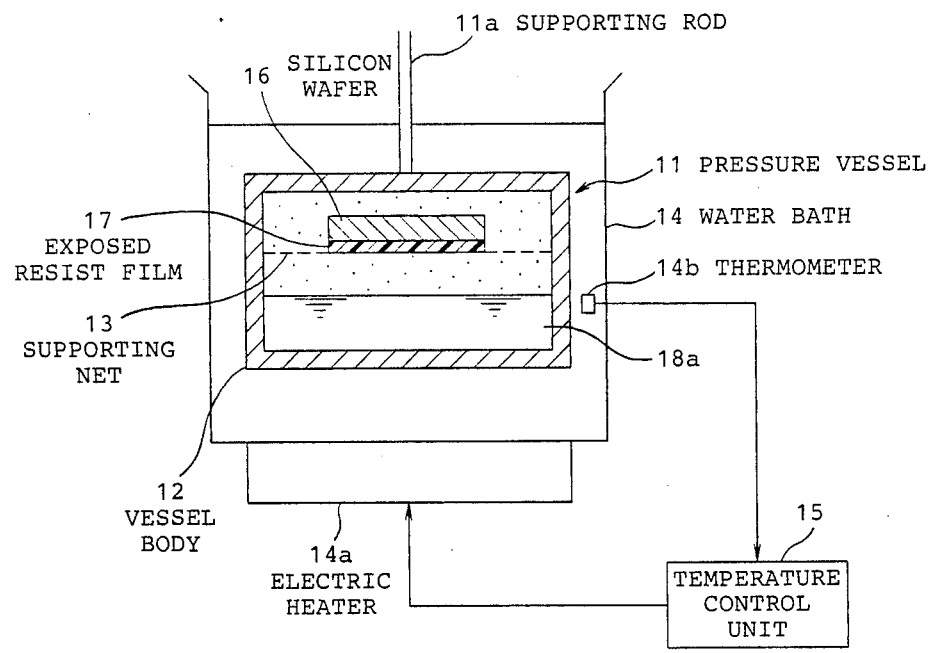
FIG. 1 is a cross sectional view of a pressure vessel for use in a method according to this invention when an exposed resist film is positioned in the pressure vessel together with a substrate.

Referring to FIG. 1, the processing step is carried out by the use of a pressure vessel or chamber 11. The pressure vessel 11 comprises a vessel body 12 defining an inner space, a supporting net 13 disposed in the inner space, an inlet port (not shown) for introducing a fluid into the inner space. The pressure vessel 11 is supported by a supporting rod 11a to be lowered by a driving mechanism (not shown) and is immersed in a water bath 14. An electric heater 14a is attached to a bottom surface of the water bath 14 to heat the water bath 14. A thermometer 14b is positioned within the water bath 14 to detect the temperature of the water bath 14 as a detected temperature. A temperature conrol unit 15 is connected to the electric heater 14a and the thermometer 14b and controls the temperature of the water bath 14 in accordance with the detected temperature, so that the pressure vessel 11 is kept at a desirable temperature.

The silicon wafer 16 which has the exposed resist film 17 is introduced into the pressure vessel 11 and is positioned on the supporting net 13 with the exposed resist film 17 directed downwards in FIG. 1. In this case, the pressure vessel 11 is kept at a vacuum.

A predetermined volume of carbon dioxide gas ($CO_2$) is supplied through the inlet port. The pressure vessel 11 is cooled to liquefy the carbon dioxide. The liquefied carbon dioxide fills the pressure vessel 11 to the extent that the supporting net 13 is not immersed in the liquefied carbon dioxide 18a. Carbon dioxide has a critical temperature of 31° C., a critical pressure of 72.8 atmospheric pressure, and a critical density of 0.468 $g/cm^3$. In this event, pressure vessel 11 is kept at a first initial temperature lower than the critical temperature of carbon dioxide.

Figure 2:
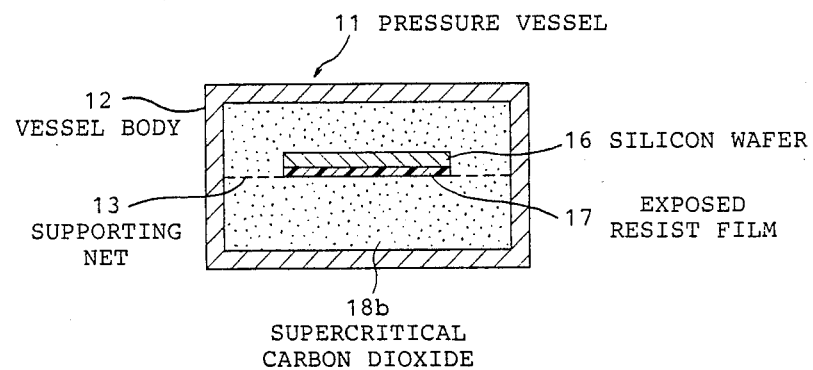
FIG. 2 is a cross sectional view of a pressure vessel for use in a method according to this invention when an exposed resist film is developed in a supercritical atmosphere together with a substrate.
Figure 3:
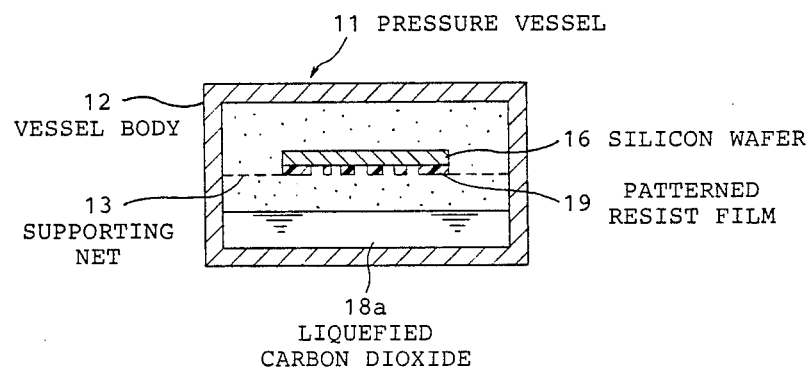
FIG. 3 is a cross sectional view of a pressure vessel for use in a method according to this invention when an exposed resist film is processed into a patterned resist film.

Referring to FIGS. 2 and 3 together with FIG. 1, the pressure vessel 11 is immersed within the water bath 14 after the carbon dioxide is liquefied in the pressure vessel 11. The water bath 14 is controlled in advance at a controlled temperature of, for example, 46° C. higher than the critical temperature of the carbon dioxide by the temperature control unit 15 so that the pressure vessel 11 is raised to the controlled temperature. Thus, the controlled temperature of the pressure vessel 11 is mainly governed by the temeprature control unit 15. In FIGS. 2 and 3, the water bath 14, the temperature control unit 15, and the heater 14a are omitted for brevity of description. The liquefied carbon dioxide 18a is converted to supercritical carbon dioxide 18b having the density of 0.6 $g/cm^3$, as illustrated in FIG. 2. Thus, the exposed resist film 17 is kept with the silicon wafer 16 in a supercritical atmosphere of the carbon dioxide. The supercritical atmosphere lasts for a first predetermined time of, for example, thirty minutes under control of the temperature control unit.

This supercritical carbon dioxide 18b is remarkably higher in pressure that atmospheric pressure and has consequently a high density. The density of the supercritical carbon dioxide 18b can be higher than, or comparable to the density of normal liquefied carbon dioxide. Under the circumstances, the supercritical carbon dioxide 18b may be considered as being a pseudo-liquid. When compared with a liquid, for example, liquefied carbon dioxide, the supercritical carbon dioxide 18b has a kinematic viscosity greatly lower than that of liquefied carbon dioxide and a diffusion coefficient greatly higher than that of liquefied carbon dioxide as disclosed in Kagaku To Kōgyō (Chemistry and Chemical Industry), Vol. 40, 1987, page 753. As a result, it seems that the molecular activity is higher in the supercritical carbon dioxide 18b as compared to the liquid state. Accordingly, the molecules of the supercritical carbon dioxide 18b are capable of reacting vigorously with the exposed resist film 17 so that the exposed resist film 17 is selectively removed in accordance with the latent image of the predetermined pattern as described hereinafter. Namely, the exposed resist film 17 is developed in the supercritical atmosphere into a patterned resist film having the predetermined pattern.

The exposed resist film 17 has a first part corresponding to the latent image and a second part which has not exposed. The first part is a low molecular weight as compared with the second part. As a result, the first part is removed easily as compared with the second part when the exposed resist film is kept in the supercritical atmosphere. Therefore, only the first part can be removed by determining in advance a time duration during which the exposed resist film is kept in the supercritical atmosphere.

After a lapse of time of thirty minutes, the pressure vessel 11 is lifted out of the water bath 14. As a result, the temperature of the pressure vessel 11 is dropped or returned to the first initial temperature so that the supercritical carbon dioxide 18b is liquefied. This means that the temperature control unit 15 controls the temperature of the pressure vessel 11. The patterned resist film 19 is formed on the surface layer, as illustrated in FIG. 3. Thus, the exposed resist pattern is developed by the use of the supercritical carbon dioxide 18b. Namely, the exposed resist film is selectively removed without the use of solvent. This means that use of the supercritical carbon dioxide 18b dispenses with rinsing and drying steps which are carried out after a developing step of a resist pattern in the conventional method.

In order to confirm the effectiveness of the above-mentioned method, the depth of the patterned resist film has been measured by a stepping meter of a contact type, for example, a Talystep manufactured and sold by Rank Taylor Hobson Corporation. As a result, it has been found out that the depth reaches 3200 angstroms.

An etching step may be carried out for forming a patterned surface layer through the patterned resist film in the manner known in the art after the exposed resist film is processed into the patterned resist film during the processing step.

Figure 4:
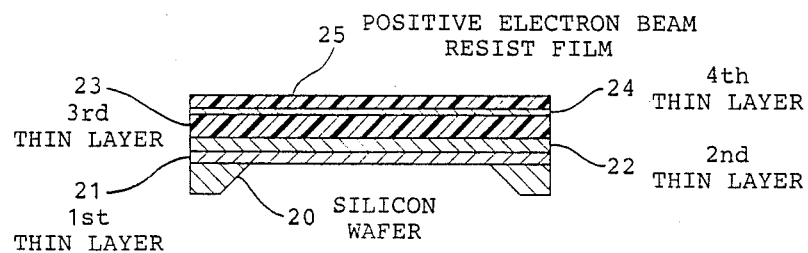
FIG. 4 is a cross sectional view of an X-ray mask blank after a processing step according to this invention.

Referring to FIG. 4, description will be made as regards a method according to a second embodiment of this invention.

Preliminary Step

A disc shaped silicon wafer 20 is prepared at first as a substrate which has a diameter of 3 inches and a thickness of 200 $\mu$m. The silicon wafer 20 has a front surface and a back surface directed upwards and downwards in FIG. 4, respectively. A first thin layer 21 of silicon nitride is deposited to a thickness of 2 $\mu$m on the first surface by reactive sputtering. The silicon wafer 20 is etched out at the central portion of the back surface with only a peripheral portion of the substrate left.

A second thin layer 22 of tantalum is deposited to a thickness of 0.6 $\mu$m on the first thin layer by sputtering. Thereafter, a third thin layer 23 is deposited to a thickness of 2.5 $\mu$m on the second thin layer 22 in a manner known in the art. The third thin layer 23 may be a resist film which consists of, for example, photoresist AZ1350J which is manufactured and sold by the Hoechst Corporation and which is hard baked at a temperature of 200° C. A fourth thin layer 24 of silicon dioxide is formed to a thickness of 1000 angstroms on the third thin layer 23.

A positive electron beam resist film 25 of, for example, polymethyl methacrylate (PMMA) is deposited to thickness of 3000 angstroms on the fourth thin layer 24 with the silicon wafer 20 spin-coated in a known manner together with the first through the fourth thin layers. Thus, an X-ray mask blank is manufactured.

The positive electron beam resist film 25 is pre-processed into a pre-processed resist film having a latent image of a predetermined pattern. More specifically, the positive electron beam resist film 25 is exposed in conformity with the predetermined pattern by the use of an electron beam delineating device to pre-process the positive electron beam resist film 25 into the pre-processed resist film. The pre-processed resist film may be referred to as an exposed resist film. In this case, the electron beam delineating device develops an acceleration voltage of, for example, 20 kilo volts to accelerate electrons. The accelerated electrons are irradiated in the form of an electron beam onto the positive electron beam resist film so as to form the latent image in the positive electron beam resist film. Typically, the doses of electron beam are, for example, 60 $\mu$C/cm$^2$. The predetermined pattern is assumed to have a feature dimension of 0.5 $\mu$m of line and space widths.

A processing step is carried out to process the exposed resist film into a patterned resist film after the exposing step.

Processing Step

As in FIG. 1, the X-ray mask blank which has the exposed resist film 25 is introduced into a pressuure vessel 11 kept at a vacuum and is positioned on the supporting net 13 with the exposed resist film directed downwards in FIG. 1. A gaseous fluid of a prescribed amount is supplied into the pressure vessel 11 through the inlet port and is cooled to form a liquefied fluid. The liquefied fluid may comprise methyl isobutyl ketone of 0.5 weight % and the balance consisting of carbon dioxide. In this case, the pressure vessel 11 is kept at a temperature lower than the critical temperature of the gaseous fluid. After the gaseous fluid is liquefied in the pressure vessel 11, the temperature control unit controls the temperature of the pressure vessel 11 to raise the temperature of the pressure vessel 11 to a temperature of 45° C. so that the liquefied fluid is coverted to a supercritical fluid having a density of 0.55 g/cm$^3$. In this case, the temperature control unit keeps the pressure vessel 11 at the temperature of 45° C. for five minutes. As described in the first embodiment, the exposed resist film if developed in accordance with the latent image to form the patterned resist film.

In order to confirm the effectiveness of the above processing step, the depth of the patterned resist film has been measured by the stepping meter used in the first embodiment. As a result, it has been found that the depth reaches 3000 angstroms.

Figure 5:
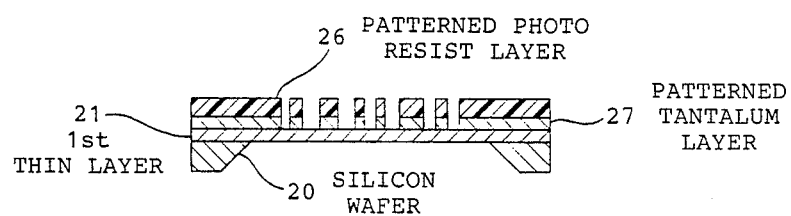
FIG. 5 is a cross sectional view of an X-ray mask after a removing step according to this invention.

After the processing step, a first transferring or transcribing step is carried out wherein the fourth thin layer 24 of silicon dioxide of the X-ray mask blank is etched through the patterned resist film by reactive ion etching to transfer the predetermined pattern of the patterned resist film to the fourth thin layer 24. As a result, the fourth thin layer 24 is processed into a patterned silicon dioxide layer. When the first transferring step is completed, the third thin layer 23 of the photoresist is etched through the patterned resist film and the patterned silicon dioxide layer by the reactive ion etching within an atmosphere of oxygen gas to transfer the predetermined pattern to the third thin layer 23. This step may therefore be named a second transferring or transcribing step. During the second transcribing step, the patterned resist film and the patterned silicon dioxide layer act as a mask. At any rate, the third thin layer 23 of photoresist is processed into a patterned photoresist layer 26 having a thickness of about 1.5 $\mu$m, as illustrated in FIG. 5. Following the second transferring step, the X-ray mask blank is subjected to a third transferring step to etch the second thin layer 22 of tantalum through the patterned photoresist layer 26 by the reactive ion etching within an atmosphere of chlorine gas to transfer the predetermined pattern to the second thin layer 22. Thus, the second thin layer 22 of tantalum is patterned into a patterned tantalum layer 27. As the result of the first through the third transferring steps, the predetermined pattern is formed on the second thin layer 22 as an unpatterned surface layer through the patterned photoresist layer 26, as shown in FIG. 5. Thus, the second thin layer 22 is selectively removed through the patterned photoresist layer 26 to form the patterned tantalum layer 27.

Removing step of the Patterned Resist Layer (or Film)

After formation of the patterned tantalum layer 27, a removing step is carried out so as to remove the patterned photoresist layer 26 from the patterned tantalum layer 27 which may be called a patterned surface layer. The silicon wafer 20 is introduced into the pressure vessel 11 (FIG. 1) with the patterned tantalum layer 237 and the patterned photoresist layer 26 attached thereto and is positioned on the supporting net 13 with the photoresist layer 26 directed downwards as in FIG. 1. A gaseous fluid is supplied into the pressure vessel 11 through the inlet port and is cooled into a liquefied fluid. The liquefied fluid consists of methyl isobutyl ketone of 7 weight %, the balance consisting of carbon dioxide. In this case, the pressure vessel 11 is kept at a vacuum and an initial temperature lower than the critical temperature of the gaseous fluid. The temperature control unit raises the temperature of the pressure vessel 11 to 45° C. and the temperature of the pressure vessel 11 is maintained at 45° C. for forty-five minutes. Namely, the temeprature of the pressure vessel 11 has been raised from the initial temperature to the temperature of 45° C. and maintained for forty-five minutes. When the temperature of the pressure vessel 11 is raised to the temperature of 45° C., the liquefied fluid is converted to a supercritical fluid having a density of 0.55 g/cm$^3$. That is, the silicon wafer 20 is kept within a supercritical atmosphere. The patterned photoresist layer 26 is removed by the supercritical fluid to manufacture the silicon wafer 11 having the patterned tantalum layer 27 of an X-ray mask.

The temperature of the pressure vessel 11 is controlled to the initial temperature lower than the critical temperature by the temperature control unit. As a result, the supercritical fluid returns to the liquid state.

When observing the X-ray mask by means of a projection lamp and an optical microscope of fifty mangifications, the patterned photoresist layer 26 has been perfectly removed from the X-ray mask. In addition, it has been confirmed that the first thin layer 21 suffered no damage whatsoever.

Next, description will be made as regards a method according to a third embodiment of this invention.

A base plate such as a silicon wafer is successively stacked with an intermediate layer and a surface layer in order to form an electroluminescent panel. In this case, a substrate comprises the base plate and the intermediate layer. The intermediate layer may comprise a transparent electrode on the substrate, a plurality of dielectric layers, and an electroluminescent layer interposed between the dielectric layers. At any rate, the intermediate layer may be composed of seven layers. On the intermediate layer, the surface layer is deposited as a back electrode. In this connection, the surface layer may be aluminum and will therefore be referred to as an aluminum layer.

When a predetermined pattern is formed on the aluminum layer to process the aluminum layer into a patterned aluminum layer, a resist film is formed on the aluminum layer and is processed into a patterned resist film having a wiring pattern in the manner similar to the first embodiment. The aluminum layer is selectively etched through the patterned resist film to form a patterned aluminum layer having the wiring pattern as the back electrode.

The substrate is introduced into the pressure vessel 11 (FIG. 1) together with the patterned aluminum layer in the manner similar to the first embodiment. A gaseous fluid is supplied into the pressure vessel 11 through the inlet port. The gaseous fluid consists of emthyl isobutyl ketone of 5 weight % and the balance of carbon dioxide. The gaseous fluid is cooled into a liquefied fluid. After the gaseous fluid is liquefied in the pressure vessel 11, the temperature control unit controls the temperature of the pressure vessel 11 at 45° C. for thirty minutes. When the temperature of the pressure vessel 11 is raised to 45° C., the liquefied fluid is rendered into a supercritical fluid having a density of 0.50 g/cm$^3$. Thus, the substrate is kept at a supercritical atmosphere together with the patterned aluminum thin layer and the patterned resist film for thirty minutes. As a result, the patterned resist film is removed from the patterned aluminum thin layer so that the electrominescent panel is manufactured.

When the electroluminescent panel thus manufactured has been measured by the use of a projection lamp and an optical microscope of fifty magnifications, it has been confirmed that the patterned resist film has been perfectly removed from the electroluminescent panel. In addition, it has also been confirmed that the electroluminescent panel does not suffer from any damage.

Alternatively, a method according to this invention may be also used to wash a patterned surface layer attached to a substrate. In this event, the patterned surface layer is kept in a supercritical atmosphere after removal of the resist film during a predetermined time duration. This shows that the method according to this invention is also useful to clean up the patterned surface layer.

Figure 6:
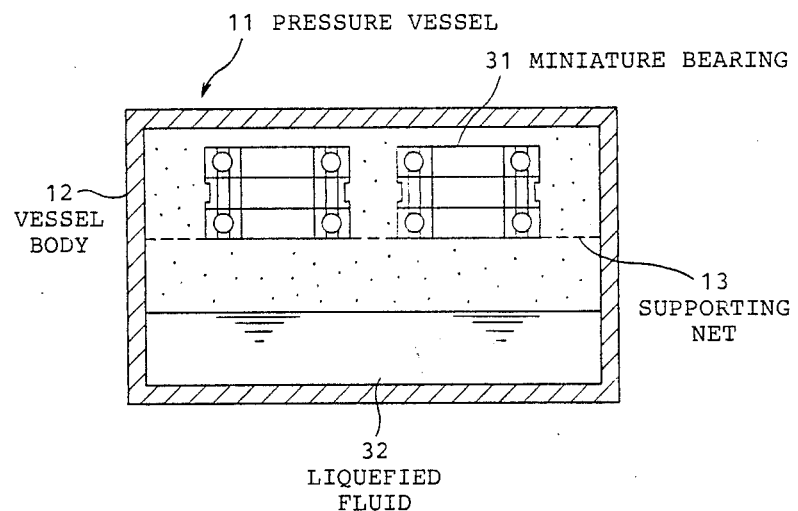
FIG. 6 is a cross sectional view of a pressure vessel for use in a method according to this invention when a plurality of miniature bearings are positioned in the pressure vessel.

Referring to FIG. 6, a method according to this invention may be further used to wash or clean an article, such as a compact disc, mechanical parts, or the like, which may not always be manufactured by the use of a resist film. A plurality of miniature bearings 31 are introduced into the pressure vessel 11 (FIG. 1) in a manner similar to the first embodiment. A gaseous fluid is supplied into the pressure vessel 11 through the inlet port. The gaseous fluid is cooled into a liquefied fluid 32. After the gaseous fluid is liquefied in the pressure vessel 11, the liquefied fluid 32 consists of methyl isobutyl ketone of 5 weight % and the balance consisting of carbon dioxide. The temperature control unit controls the temperature of the pressure vessel 11 to keep the pressure vessel 11 at 45° C. for thirty minutes. When the temperature of the pressure vessel 11 is raised to 45° C., the liquefied fluid 32 becomes a supercritical fluid having a density of 0.50 g/cm$^3$, as in the other embodiments. Thus, the miniature bearings 31 are kept in a supercritical atmosphere for thirty minutes. As a result, stains and dust are favorably removed from the miniature bearings 31. Such washing may be used for removing oil or grease before the substrate is subjected to plating.

While this invention has thus far been described in conjunction with preferred embodiments thereof, it will readily be possible for those skilled in the art to put this invention into practice in various other ways. For example, the supercritical fluid may be selected from the group consisting of inert gases, hydrocarbons, and fluorocarbons. Furthermore, a resist film that may be treated by this method can be a negative type resist or a polymer film such as polymide instead of a positive type resist. In addition, a liquefied fluid may be introduced into the pressure vessel instead of a gaseous fluid so as to save a cooling step. A thermostatically controlled oven may be used instead of a water bath.

What is claimed is:

1. A method of forming a patterned resist film having a predetermined pattern on a surface layer formed on a substrate, said method comprising the steps of depositing a resist film on said surface layer, pre-processing said resist film into a pre-processed resist film which is attached to said surface layer and which has a latent image of said predetermined pattern, and processing said pre-processed resist film into said patterned resist film, said processing step comprising the steps of:

introducing said pre-processed resist film together with said substrate into a supercritical atmosphere; and developing said pre-processed resist film in said supercritical atmosphere to selectively remove said pre-processed resist film in accordance with said latent image and to thereby form said patterned resist film.

2. A method as claimed in claim 1, said pre-processed resist film introducing step comprising the steps of:

positioning said pre-processed resist film together with said substrate within a pressure vessel;

supplying said pressure vessel with a fluid of a predetermined volume; and putting said fluid into a supercritical fluid to provide said supercritical atmosphere.

3. A method as claimed in claim 2, said fluid supplying step comprising the steps of:

entering a gaseous fluid into said pressure vessel; and cooling said gaseous fluid into a liquefied fluid.

4. A method as claimed in claim 2, wherein said fluid is liquefied.

5. A method as claimed in claim 3, wherein said supercritical fluid has a density which is not lower than that of said liquefied fluid to keep said pressure vessel at a pressure higher than the atmospheric pressure.

6. A method as claimed in claim 5, said pressure vessel being kept at an initial temperature lowre than a predetermined temperature corresponding to a critical temperature of said liquefied fluid in said supplying step, wherein said pre-processed resist film putting step comprises the step of:

raising the temperature of said pressure vessel to a prescribed temperature higher than said critical temperature to thereby convert said liquefied fluid into said supercritical fluid.

7. A method as claimed in claim 6, said pre-processed resist film developing step comprising the steps of:

keeping said prescribed temperature during a predetermined time duration to develop said pre-processed resist film to said patterned resist film; and lowering the temperature of said pressure vessel to said initial temperatuure to thereby convert said supercritical fluid into said liquefied fluid.

8. A method as claimed in claim 7, wherein said liquefied fluid is a material selected from the group consisting of carbon dioxide, inert gases, an assortment of hydrocarbons and fluorocarbons, halogens, an oxygen.

9. A method of forming a patterned surface layer on a substrate, said method comprising the steps of:

forming an unpatterned surface layer on said substrate;

forming a patterned resist film on said unpatterned surface layer;

selectively removing said unpatterned surfaced layer through said patterned resist film to form said patterned surface layer;

introducing said patterned resist film into a supercritical atmosphere together with said substrate having said patterned surface layer; and removing said patterned resist film from said patterned surface layer within said supercritical atmosphere.

10. A method as claimed in claim 9, wherein said patterned resist film introducing step comprises the steps of:

positioning said patterned resist film within a pressure vessel with said patterned surface layer attached to said substrate;

supplying said pressure vessel with a fluid at a predetermined volume; and putting said fluid into a supercritical fluid to introduce said patterned resist film into said supercritical atmosphere.

11. A method as claimed in claim 10, said fluid supplying step comprising the steps of:

entering a gaseous fluid into said pressure vessel; and cooling said gaseous fluid into a liquefied fluid.

12. A method as claimed in claim 10, wherein said fluid is liquefied.

13. A method as claimed in claim 11, wherein said supercritical fluid has a density which is not lower than that of said liquefied fluid to keep said pressure vessel at a pressure higher than the atmospheric pressure.

14. A method as claimed in claim 11, said pressure vessel being kept at an initial temperature lower than a predetermined temperature corresponding to a critical temperature of said liquefied fluid in supplying step, wherein said patterned resist film putting step comprising the step of:

raising the temperature of said pressure vessel to a prescribed temperature higher than said critical temperature to thereby convert said liquefied fluid into said supercritical fluid.

15. A method as claimed in claim 14, said patterned resist film removing step comprising the steps of:

keeping said prescribed temperature during a predetermined time duration to remove said patterned resist film from said patterned surface layer; and lowering the temperature of said pressure vessel to said predetermined temperature to thereby convert said supercritical fluid into said liquefied fluid.

16. A method as claimed in claim 15, wherein said liquefied fluid is a material selected from the group consisting of carbon dioxide, inert gases, an assortment of hydrocarbons and fluorocarbons, halogens, and oxygen.

17. A method as claimed in claim 16, wherein said liquefied fluid includes an organic solvent of a prescribed amount.

18. A method as claimed in claim 3, said pressure vessel being kept at an initial temperature lower than a predetermined temperature corresponding to a critical temperature of said liquefied fluid in supplying step, wherein said patterned resist film putting step comprising the step of:

raising the temperature of said pressure vessel to a prescribed temperature higher than said critical temperature to thereby convert said liquefied fluid into said supercritical fluid.

19. A method of washing a patterned surface layer on a substrate within a pressure vessel, said pressure vessel being kept at an initial temperature lower than a predetermined temperature corresponding to the critical temperature of a fluid of a predetermined volume which is supplied to said pressure vessel, said method comprising the steps of:

positioning said patterned surface layer together with said substrate within said pressure vessel;

supplying said pressure vessel with said fluid;

raising the temperature of said pressure vessel to a prescribed temperature higher than said critical temperature to thereby convert said fluid into a supercritical state; and maintaining said prescribed temperature for a predetermined duration of time to wash said patterned surface layer within said supercritical fluid.

20. A method of washing an article within a pressure vessel, said pressure vessel being kept at an initial temperature lower than a predetermined temperature corresponding to a critical temperature of a fluid of a predetermined volume which is supplied to said pressure vessel, said method comprising the steps of:

positioning said article within said pressure vessel;

supplying said pressure vessel with said fluid;

raising the temperature of said pressure vessel to a prescribed temperature higher than said critical temperature to thereby convert said fluid into a supercritical state; and maintaining said prescribed temperature for a predetermined duration of time to wash said article within said supercritical fluid.

* * * * *